US012660124B2

(12) United States Patent (10) Patent No.: US 12,660,124 B2
Kudo et al. (45) Date of Patent: Jun. 16, 2026

(54) ELECTRONIC DEVICE AND POWER CONVERSION DEVICE

(71) Applicants:Hitachi Astemo, Ltd., Hitachinaka (JP); HONDA MOTOR CO., LTD., Tokyo (JP)

(72) Inventors: Daiki Kudo, Hitachinaka (JP); Yoshiharu Tanabe, Hitachinaka (JP); Kohei Nakano, Hitachinaka (JP); Hiroyuki Nakade, Hitachinaka (JP); Kenichi Sasaki, Utsunomiya (JP); Takahiro Uneme, Tokyo (JP); Ryuta Wakabayashi, Tokyo (JP)

(73) Assignees: HITACHI ASTEMO, LTD., Hitachinaka (JP); HONDA MOTOR CO., LTD., Tokyo (JP)

( * ) Notice: Subject to any disclaimer, the term of this patent is extended or adjusted under 35 U.S.C. 154(b) by 194 days.

(21) Appl. No.: 18/524,763

(22) Filed: Nov. 30, 2023

(65) Prior Publication Data

US 2024/0188252 A1 Jun. 6, 2024

(30) Foreign Application Priority Data

Dec. 1, 2022 (JP) ................................ 2022-192757

(51) Int. Cl.
*H05K 7/20* (2006.01)
*H05K 7/14* (2006.01)
(52) U.S. Cl.
CPC ..... *H05K 7/20272* (2013.01); *H05K 7/14322* (2022.08); *H05K 7/20927* (2013.01)

(58) Field of Classification Search
None
See application file for complete search history.

(56) References Cited

U.S. PATENT DOCUMENTS

| | | | | |
|---|---|---|---|---|
| 7,104,078 B2 * | 9/2006 | Tilton | ................. | H01L 23/4735 |
| | | | | 62/171 |
| 7,231,960 B2 * | 6/2007 | Sakai | .................... | H01L 23/473 |
| | | | | 165/83 |
| 7,299,647 B2 * | 11/2007 | Tilton | ....................... | F28D 5/00 |
| | | | | 361/699 |

(Continued)

FOREIGN PATENT DOCUMENTS

JP 6760691 B1 9/2020

*Primary Examiner* — Courtney L Smith
(74) *Attorney, Agent, or Firm* — CANTOR COLBURN LLP

(57) ABSTRACT

An electronic device includes a supply refrigerant pipe that is connected to an opening end. The supply refrigerant pipe has a connection opening end that is directly connected to the opening end, a refrigerant pipe-side reduced diameter flow path in which flow path area decreases with increasing distance from the connection opening end, and a small diameter flow path connected to an end portion of the refrigerant pipe-side reduced diameter flow path on a side opposite to the connection opening end A main body case has, as parts of the refrigerant flow path, a case-side reduced diameter flow path in which flow path area decreases with increasing distance from the opening end, and a flat flow path formed in a shape flatter than the small diameter flow path and connected to an end portion of the case-side reduced diameter flow path on a side opposite to the opening end.

7 Claims, 5 Drawing Sheets

(56)  References Cited

U.S. PATENT DOCUMENTS

| | | | | |
|---|---|---|---|---|
| 8,203,839 | B2 * | 6/2012 | Dede ......................... | F28F 7/02 |
| | | | | 361/677 |
| 11,382,238 | B2 * | 7/2022 | Takagi ............... | H05K 7/20309 |
| 11,432,419 | B2 * | 8/2022 | Suwa ................ | H01L 23/49575 |
| 2007/0183125 | A1 * | 8/2007 | Tilton ................. | H01L 23/4735 |
| | | | | 361/699 |
| 2012/0287655 | A1 * | 11/2012 | Mou ................. | H05K 7/20254 |
| | | | | 165/104.11 |
| 2013/0229097 | A1 * | 9/2013 | Tamai ................... | H05K 5/064 |
| | | | | 312/223.6 |
| 2014/0140117 | A1 * | 5/2014 | Ishibashi ............ | H05K 7/20927 |
| | | | | 363/141 |
| 2020/0064718 | A1 * | 2/2020 | Aoki ................. | H05K 7/20336 |
| 2021/0296966 | A1 * | 9/2021 | Yagyu ................... | H02K 5/203 |
| 2022/0354025 | A1 * | 11/2022 | Varela Benitez .. | H05K 7/20272 |

* cited by examiner

ELECTRONIC DEVICE AND POWER CONVERSION DEVICE

CROSS REFERENCES TO RELATED APPLICATIONS

The present invention claims priority under 35 U.S.C. § 119 to Japanese Application, 2022-192757, filed on Dec. 1, 2022, the entire contents of which being incorporated herein by reference.

BACKGROUND OF THE INVENTION

Description of Related Art

For example, Japanese Patent No. 6760691 discloses a power conversion device provided with electronic components. The power conversion device includes a case that accommodates the electronic components.

Further, a refrigerant flow path for guiding a refrigerant is provided inside the case. A pipe is connected to such a case, and a refrigerant can flow into and out from a refrigerant flow path through the pipe. The electronic components are cooled by the refrigerant flowing through the refrigerant flow path.

SUMMARY OF THE INVENTION

Incidentally, in an electronic device such as a power conversion device, in order to supply a refrigerant to a refrigerant flow path provided inside a case, in general, a refrigerant pipe is connected to the case from the outside of the case. For example, an opening end of the refrigerant flow path is provided on the side surface of the case. An end portion of the refrigerant pipe is inserted into the opening end. However, in a case where the refrigerant pipe is inserted into the case, a portion where the end portion of the refrigerant pipe is present needs to have a larger dimension than the outer diameter of the refrigerant pipe. Therefore, in a case where the refrigerant pipe is inserted into the case, the case is formed to have a thickness larger than the outer diameter of the refrigerant pipe in a range in which the end portion of the refrigerant pipe is located. For this reason, it is difficult to make the electronic device thinner.

The present invention has been made in view of the problems described above and has an object to make it possible to reduce a thickness in an electronic device in which a refrigerant is supplied inside a case.

The present invention adopts the following configuration as means for solving the above problems.

According to an aspect of the present invention, there is provided an electronic device including: an electronic component; a main body case which accommodates the electronic component and in which an opening end of a refrigerant flow path is provided; and a refrigerant pipe that has a flange which is fixed to an outer wall surface of the main body case, and that is connected to the opening end, in which the refrigerant pipe has a connection opening end that is directly connected to the opening end, a refrigerant pipe-side reduced diameter flow path in which flow path area decreases with increasing distance from the connection opening end, and a small diameter flow path connected to an end portion of the refrigerant pipe-side reduced diameter flow path on a side opposite to the connection opening end, and the main body case has, as parts of the refrigerant flow path, a case-side reduced diameter flow path in which flow path area decreases with increasing distance from the opening end, and a flat flow path formed in a shape flatter than the small diameter flow path and connected to an end portion of the case-side reduced diameter flow path on a side opposite to the opening end.

According to the electronic device of the above aspect, the refrigerant pipe has a flange, and the flange is fixed to the outer wall surface of the main body case. Therefore, the refrigerant pipe and the main body case can be connected to each other without inserting the refrigerant pipe into the opening end of the main body case. Therefore, there is no need to provide a portion where the end portion of the refrigerant pipe is located inside the main body case, so that the main body case can be made thinner. Further, the refrigerant flow path has a flat flow path formed in a shape flatter than the small diameter flow path of the refrigerant pipe. Therefore, the main body case in which the refrigerant flow path is formed can be made thinner by an amount corresponding to the difference between the inner diameter dimension of the small diameter flow path and the inner diameter dimension of the flat flow path in a short direction of the flat flow path, compared to a case where a flow path having the same shape as the small diameter flow path is provided. Further, in the electronic device of the above aspect, the connection opening end of the refrigerant pipe and the opening end of the main body case are connected to each other. Further, the refrigerant pipe has the refrigerant pipe-side reduced diameter flow path in which flow path area decreases with increasing distance from the connection opening end, and the main body case has the case-side reduced diameter flow path in which flow path area decreases with increasing distance from the opening end. In such an aspect of the present invention, compared to a case where a small diameter flow path and a flat flow path, which has different shapes, are directly connected to each other, the shape of the flow path can be changed gently, so that pressure loss in the flow path can be reduced. Therefore, according to the electronic device of the above aspect, it is possible to make the main body case thinner while suppressing an increase in pressure loss, and to make the electronic device thinner while maintaining cooling efficiency.

DETAILED DESCRIPTION OF THE INVENTION

Hereinafter, embodiments of an electronic device and a power conversion device according to the present disclosure will be described with reference to the drawings.

First Embodiment

Figure 1:
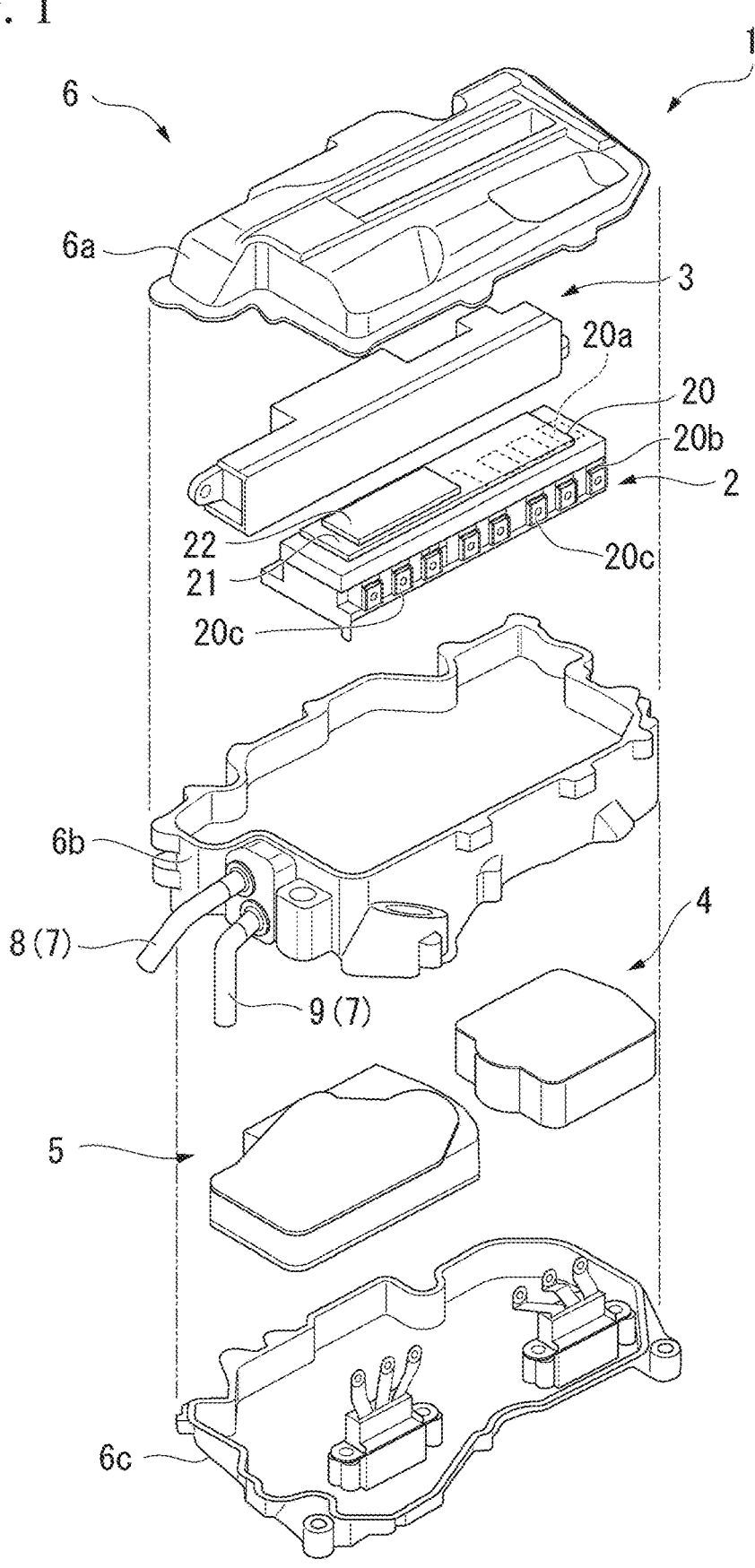
FIG. 1 is an exploded perspective view showing a schematic configuration of a power conversion device according to a first embodiment of the present invention.

FIG. 1 is an exploded perspective view showing a schematic configuration of a power conversion device 1 (an electronic device) of the present embodiment. The power conversion device 1 is mounted on a vehicle such as an electric vehicle and is provided between a motor (a load) (not shown) and a battery (not shown). As shown in FIG. 1, such a power conversion device 1 includes an intelligent power module 2 (an electronic component), a capacitor 3 (an electronic component), a reactor 4 (an electronic component), a DC-DC converter 5 (an electronic component), a main body case 6, and a refrigerant pipe 7.

The intelligent power module 2 includes a power module 20, a gate driver substrate 21, an ECU substrate 22, and the like. The power module 20 includes a plurality of power devices 20*a* each having a power semiconductor element, a power module case 20*b* which is made of resin and accommodates the power devices 20*a*, and a power module bus bar 20*c* connected to the power devices 20*a*. Further, the power module 20 includes an insulating resin member that prevents short-circuiting of the power module bus bar 20*c*, a water jacket for cooling, and the like.

The gate driver substrate 21 is a substrate in which a gate driver that generates a drive signal for a buck-boost converter or an inverter that is formed by the power device 20*a* is provided. Such a gate driver substrate 21 is stacked on the power module 20. The ECU substrate 22 is a substrate in which an electronic control unit (ECU) that controls the gate driver substrate 21 is provided. The ECU substrate 22 is stacked on the gate driver substrate 21.

The capacitor 3 is connected to the intelligent power module 2 and disposed on the side of the power module 20. The reactor 4 is disposed below the intelligent power module 2.

The DC-DC converter 5 is disposed on the side of the reactor 4 and below the intelligent power module 2. The DC-DC converter 5 converts battery power into a voltage suitable for surrounding equipment (an electronic component mounted on the gate driver substrate 21 or the ECU substrate 22, or the like).

The main body case 6 is a case that accommodates the intelligent power module 2, the capacitor 3, the reactor 4, and the DC-DC converter 5, and includes an upper case 6*a*, a central case 6*b*, and a lower case 6*c*. The upper case 6*a*, the central case 6*b*, and the lower case 6*c* are connected to be separable in a direction in which the power module 20, the gate driver substrate 21, and the ECU substrate 22 are stacked. The upper case 6*a* covers the intelligent power module 2 from the ECU substrate 22 side and is fastened to the central case 6*b*. The central case 6*b* covers the intelligent power module 2, the capacitor 3, the reactor 4, and the DC-DC converter 5. The lower case 6*c* covers the reactor 4 and the DC-DC converter 5 from below and is fastened to the central case 6*b*. A connector for connecting the intelligent power module 2 and a motor (not shown) are provided in the lower case 6*c*.

The refrigerant pipe 7 is a pipe for guiding a refrigerant X. In the present embodiment, two refrigerant pipes 7 are provided. One refrigerant pipe 7 is a pipe (hereinafter referred to as a supply refrigerant pipe 8) that guides the refrigerant X which is supplied to the inside of the main body case 6. The other refrigerant pipe 7 is a pipe (hereinafter referred to as a discharge refrigerant pipe 9) that guides the refrigerant X which is discharged from the main body case 6.

Figure 2:
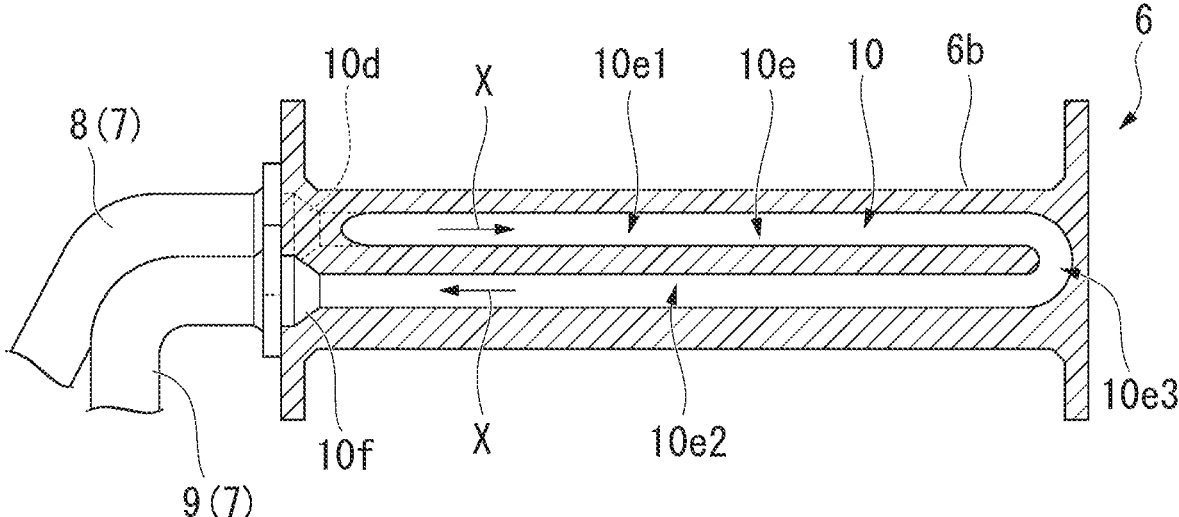
FIG. 2 is a schematic sectional view including a central case included in the power conversion device according to the first embodiment of the present invention.

FIG. 2 is a schematic sectional view including the central case 6*b*. As shown in this drawing, a refrigerant flow path 10 is provided in the central case 6*b*. The refrigerant flow path 10 is a flow path through which the refrigerant X flows and is provided inside the central case 6*b*. As shown in FIG. 2, the refrigerant flow path 10 of the present embodiment is a flow path folded back in a U-shape inside the central case 6*b*, and two opening ends 10*a* are located on a side wall surface of the central case 6*b*. That is, the central case 6*b* has the two opening ends 10*a* provided on the same side wall surface.

In the present embodiment, the opening ends 10*a* are formed to have a perfect circular shape when viewed from a direction in which the refrigerant X flows. Further, one opening end 10*a* and the other opening end 10*a* are formed to have the same size. That is, the two opening ends 10*a* have the same shape. The supply refrigerant pipe 8 is connected to one opening end 10*a*. The opening end 10*a* to which the supply refrigerant pipe 8 is connected is referred to as an inlet opening end 10*b*. Further, the discharge refrigerant pipe 9 is connected to the other opening end 10*a*. The opening end 10*a* to which the discharge refrigerant pipe 9 is connected is referred to as an outlet opening end 10*c*.

The refrigerant X that is guided by the supply refrigerant pipe 8 flows from the inlet opening end 10*b* into the refrigerant flow path 10 provided in such a central case 6*b*. The refrigerant X that has flowed into the inlet opening end 10*b* flows inside the refrigerant flow path 10 and reaches the outlet opening end 10*c*. The refrigerant X that has reached the outlet opening end 10*c* is guided to the discharge refrigerant pipe 9 and discharged to the outside.

Figure 3:
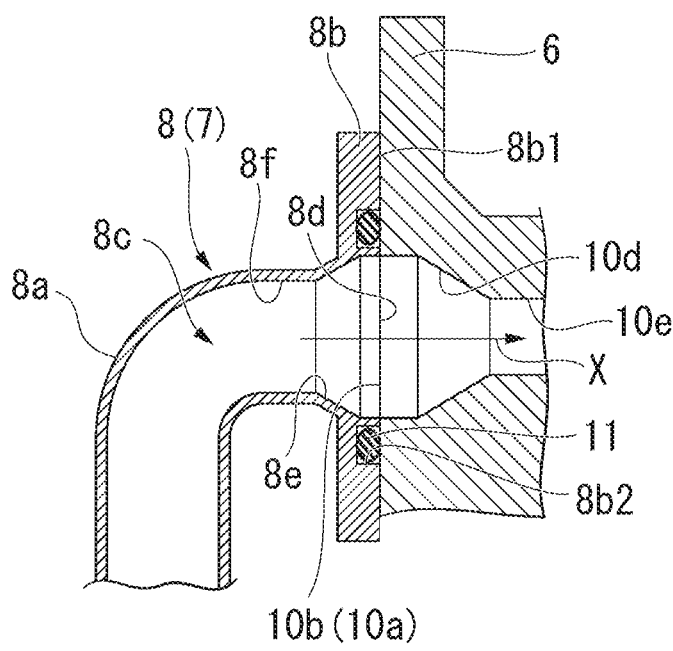
FIG. 3 is an enlarged schematic sectional view of a joint portion between a supply refrigerant pipe and an inlet opening end included in the power conversion device according to the first embodiment of the present invention.

FIG. 3 is an enlarged schematic sectional view of a joint portion between the supply refrigerant pipe 8 and the inlet opening end 10*b*. As shown in this drawing, the supply refrigerant pipe 8 has a pipe main body part 8*a* and a flange 8*b*. The pipe main body part 8*a* is a circular pipe-shaped portion through which the refrigerant X flows and is provided in a partially curved state as necessary. The flange 8*b* is provided at an end portion of the pipe main body part 8*a* and is provided in a disk shape so as to protrude from the pipe main body part 8*a* toward the outside in the radial direction of the pipe main body part 8*a*. The shape of the flange 8*b* does not need to be necessarily a disk shape. The surface of such a flange 8*b* on the side opposite to the pipe main body part 8*a* is a contact surface 8*b*1 which comes into contact with the outer wall surface of the central case 6*b*. A flow path 8*c* is provided inside such a supply refrigerant pipe 8. The flow path 8*c* is a flow path through which the refrigerant X is guided.

Figure 4:
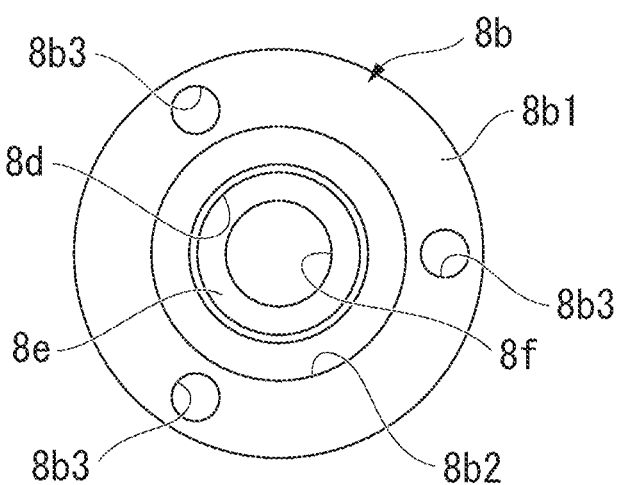
FIG. 4 is a schematic diagram of the supply refrigerant pipe included in the power conversion device according to the first embodiment of the present invention, as viewed from a contact surface side of a flange.

FIG. 4 is a schematic diagram of the supply refrigerant pipe 8 as viewed from the contact surface 8b1 side of the flange 8b. As shown in this drawing, an opening end (a connection opening end 8d) of the flow path 8c is provided on the contact surface 8b1 of the flange 8b. The connection opening end 8d of the flow path 8c is an opening portion that is directly connected to the inlet opening end 10b of the central case 6b. In the present embodiment, the connection opening end 8d is formed to have a perfect circular shape when viewed from the direction in which the refrigerant X flows. Further, the connection opening end 8d is formed to have the same diameter as the inlet opening end 10b. That is, in the present embodiment, the connection opening end 8d is formed in the same shape as the inlet opening end 10b.

It is preferable that the connection opening end 8d and the inlet opening end 10b have the same shape in order to prevent the flow of the refrigerant X from being obstructed. However, the shapes of the connection opening end 8d and the inlet opening end 10b do not need to be necessarily the same and may be different shapes.

An annular groove portion 8b2 in which a seal ring 11 is disposed is provided on the contact surface 8b1 of the flange 8b. The groove portion 8b2 is provided to surround the connection opening end 8d. Further, a screw hole 8b3 through which a screw (not shown) is inserted is provided in the flange 8b to penetrate the flange 8b. Such a flange 8b is fastened to the outer wall surface of the central case 6b by a screw inserted into the screw hole 8b3. The flange 8b is fastened to the central case 6b, so that the connection opening end 8d and the inlet opening end 10b are connected to each other.

As shown in FIG. 3, a refrigerant pipe-side reduced diameter flow path 8e and a small diameter flow path 8f are provided in the flow path 8c of the supply refrigerant pipe 8. That is, the supply refrigerant pipe 8 has the refrigerant pipe-side reduced diameter flow path 8e that is a part of the flow path 8c, and the small diameter flow path 8f that is a part of the flow path 8c.

The refrigerant pipe-side reduced diameter flow path 8e is located closer to the connection opening end 8d side than the small diameter flow path 8f is and is a flow path in which flow path area decreases with increasing distance from the connection opening end 8d. The inner wall surface of such a refrigerant pipe-side reduced diameter flow path 8e is a tapered surface that connects the edge of the connection opening end 8d and the inner wall surface of the small diameter flow path 8f.

The small diameter flow path 8f is connected to the end portion of the refrigerant pipe-side reduced diameter flow path 8e on the side opposite to the connection opening end 8d. The small diameter flow path 8f is formed to have a perfect circular shape when viewed from the flow direction of the refrigerant X. The diameter of the small diameter flow path 8f is smaller than the diameter of the connection opening end 8d. The diameter of such a small diameter flow path 8f is set according to the flow rate of the refrigerant X that is guided by the supply refrigerant pipe 8.

Further, as shown in FIG. 3, a case-side reduced diameter flow path 10d and a flat flow path 10e are provided in the refrigerant flow path 10 of the main body case 6. That is, main body case 6 has the case-side reduced diameter flow path 10d that is a part of the refrigerant flow path 10, and the flat flow path 10e that is a part of the refrigerant flow path 10.

The case-side reduced diameter flow path 10d is located closer to the inlet opening end 10b side than the flat flow path 10e is and is a flow path in which flow path area decreases with increasing distance from the inlet opening end 10b. The inner wall surface of such a case-side reduced diameter flow path 10d is a substantially tapered surface that connects the edge of the inlet opening end 10b and the inner wall surface of the flat flow path 10e.

Figure 5:
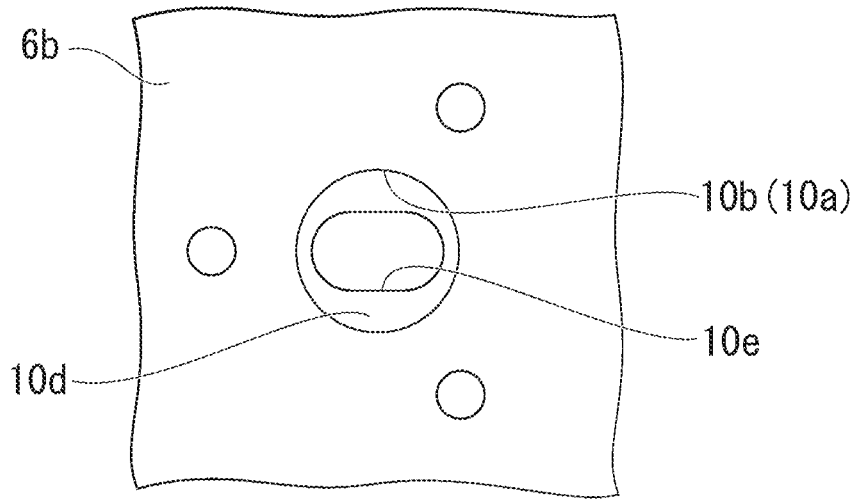
FIG. 5 is a schematic partial enlarged view of the central case with the inlet opening end in the first embodiment of the present invention facing forward.

The flat flow path 10e is connected to the end portion of the case-side reduced diameter flow path 10d on the side opposite to the inlet opening end 10b. FIG. 5 is a schematic partial enlarged view of the central case 6b with the inlet opening end 10b facing forward. As shown in this drawing, the flat flow path 10e is formed to have an oval shape when viewed from the flow direction of the refrigerant X. The flat flow path 10e is formed in a shape in which a height dimension in an up-down direction is smaller than a width dimension in a right-left direction when viewed from the flow direction of the refrigerant X. The height dimension (minor axis dimension) of the flat flow path 10e is smaller than the height dimension (diameter dimension) of the small diameter flow path 8f. Further, the width dimension (major axis dimension) of the flat flow path 10e is larger than the width dimension (diameter dimension) of the small diameter flow path 8f.

In the present embodiment, the flow path area of such a flat flow path 10e is the same as the flow path area of the small diameter flow path 8f. The flow path area of the flat flow path 10e is the same as the flow path area of the small diameter flow path 8f, so that the flow rate of the refrigerant X flowing through the flow path 8c of the supply refrigerant pipe 8 and the flow rate of the refrigerant X flowing through the refrigerant flow path 10 of the main body case 6 can be made the same.

Figure 6:
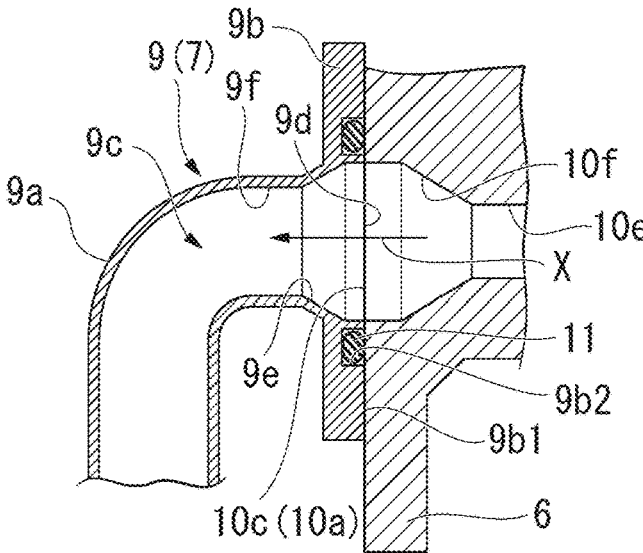
FIG. 6 is an enlarged schematic sectional view of a joint portion between a discharge refrigerant pipe and an outlet opening end included in the power conversion device according to the first embodiment of the present invention.

FIG. 6 is an enlarged schematic sectional view of a joint portion between the discharge refrigerant pipe 9 and the outlet opening end 10c. As shown in this drawing, the discharge refrigerant pipe 9 has a pipe main body part 9a and a flange 9b. The pipe main body part 9a is a circular pipe-shaped portion through which the refrigerant X flows and is provided in a partially curved state as necessary. The flange 9b is provided at an end portion of the pipe main body part 9a and is provided in a disk shape so as to protrude from the pipe main body part 9a toward the outside in the radial direction of the pipe main body part 9a. The shape of the flange 9b does not need to be necessarily a disk shape. The surface of such a flange 9b on the side opposite to the pipe main body part 9a is a contact surface 9b1 which comes into contact with the outer wall surface of the central case 6b. A flow path 9c is provided inside such a discharge refrigerant pipe 9. The flow path 9c is a flow path through which the refrigerant X is guided.

Figure 7:
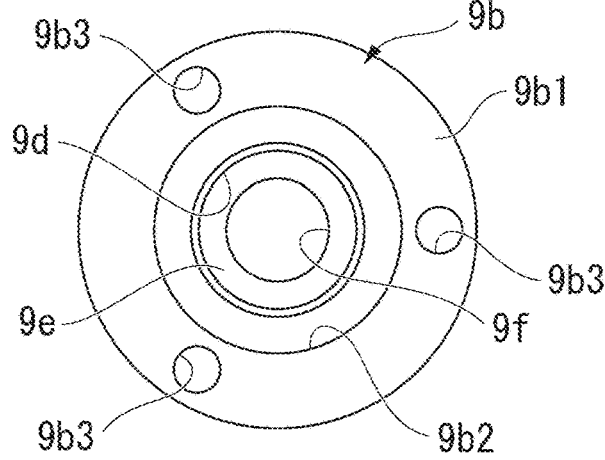
FIG. 7 is a schematic diagram of the discharge refrigerant pipe included in the power conversion device according to the first embodiment of the present invention, as viewed from a contact surface side of a flange.

FIG. 7 is a schematic diagram of the discharge refrigerant pipe 9 as viewed from the contact surface 9b1 side of the flange 9b. As shown in this drawing, an opening end (a connection opening end 9d) of the flow path 9c is provided on the contact surface 9b1 of the flange 9b. The connection opening end 9d of the flow path 9c is an opening portion that is directly connected to the outlet opening end 10c of the central case 6b. In the present embodiment, the connection opening end 9d is formed to have a perfect circular shape when viewed from the direction in which the refrigerant X flows. Further, the connection opening end 9d is formed to have the same diameter as the outlet opening end 10c. That is, in the present embodiment, the connection opening end 9d is formed in the same shape as the outlet opening end 10c.

It is preferable that the connection opening end 9d and the outlet opening end 10c have the same shape in order to prevent the flow of the refrigerant X from being obstructed. However, the shapes of the connection opening end 9d and the outlet opening end 10c do not need to be necessarily the same and may be different shapes.

An annular groove portion 9b2 in which the seal ring 11 is disposed is provided on the contact surface 9b1 of the flange 9b. The groove portion 9b2 is provided to surround the connection opening end 9d. Further, a screw hole 9b3 through which a screw (not shown) is inserted is provided in the flange 9b to penetrate the flange 9b. Such a flange 9b is fastened to the outer wall surface of the central case 6b by a screw inserted into the screw hole 9b3. The flange 9b is fastened to the central case 6b, so that the connection opening end 9d and the outlet opening end 10c are connected to each other.

As shown in FIG. 6, a refrigerant pipe-side reduced diameter flow path 9e and a small diameter flow path 9f are provided in the flow path 9c of the discharge refrigerant pipe 9. That is, the discharge refrigerant pipe 9 has the refrigerant pipe-side reduced diameter flow path 9e that is a part of the flow path 9c, and the small diameter flow path 9f that is a part of the flow path 9c.

The refrigerant pipe-side reduced diameter flow path 9e is located closer to the connection opening end 9d side than the small diameter flow path 9f is and is a flow path in which flow path area decreases with increasing distance from the connection opening end 9d. The inner wall surface of such a refrigerant pipe-side reduced diameter flow path 9e is a tapered surface that connects the edge of the connection opening end 9d and the inner wall surface of the small diameter flow path 9f.

The small diameter flow path 9f is connected to the end portion of the refrigerant pipe-side reduced diameter flow path 9e on the side opposite to the connection opening end 9d. The small diameter flow path 9f is formed to have a perfect circular shape when viewed from the flow direction of the refrigerant X. The diameter of the small diameter flow path 9f is smaller than the diameter of the connection opening end 9d. The diameter of such a small diameter flow path 9f is set according to the flow rate of the refrigerant X that is guided by the discharge refrigerant pipe 9.

Further, as shown in FIG. 6, a case-side reduced diameter flow path 10f is provided in the refrigerant flow path 10 of the main body case 6. That is, the main body case 6 has the case-side reduced diameter flow path 10f that is a part of the refrigerant flow path 10. The case-side reduced diameter flow path 10f is located closer to the outlet opening end 10c side than the flat flow path 10e is and is a flow path in which flow path area decreases with increasing distance from the outlet opening end 10c. The inner wall surface of such a case-side reduced diameter flow path 10f is a substantially tapered surface that connects the edge of the outlet opening end 10c and the inner wall surface of the flat flow path 10e.

Figure 8:
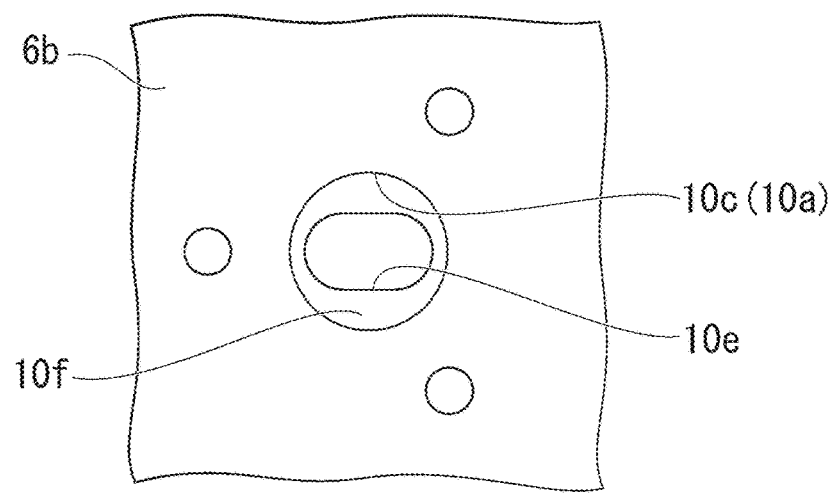
FIG. 8 is a schematic partial enlarged view of the central case with the outlet opening end in the first embodiment of the present invention facing forward.

Further, the flat flow path 10e is connected to the end portion of the case-side reduced diameter flow path 10f on the side opposite to the outlet opening end 10c. FIG. 8 is a schematic partial enlarged view of the central case 6b with the outlet opening end 10c facing forward. As shown in this drawing, the flat flow path 10e is formed to have an oval shape when viewed from the flow direction of the refrigerant X, on the outlet opening end 10c side as well. The height dimension (minor axis dimension) of the flat flow path 10e is smaller than the height dimension (diameter dimension) of the small diameter flow path 9f. Further, the width dimension (major axis dimension) of the flat flow path 10e is larger than the width dimension (diameter dimension) of the small diameter flow path 9f.

In the present embodiment, the flow path area of such a flat flow path 10e is the same as the flow path area of the small diameter flow path 9f. The flow path area of the flat flow path 10e is the same as the flow path area of the small diameter flow path 9f, so that the flow rate of the refrigerant X flowing through the flow path 9c of the discharge refrigerant pipe 9 and the flow rate of the refrigerant X flowing through the refrigerant flow path 10 of the main body case 6 can be made the same.

As shown in FIG. 2, the flat flow path 10e is formed in a folded shape by curving an intermediate portion into a U-shape, and has an upstream portion 10e1, a downstream portion 10e2, and a curved portion 10e3.

The upstream portion 10e1 is a portion that is located on the upstream side in the flow direction of the refrigerant X and linearly extends in the horizontal direction. The upstream portion 10e1 is connected to the inlet opening end 10b through the case-side reduced diameter flow path 10d. The downstream portion 10e2 is a portion that is located on the downstream side in the flow direction of the refrigerant X, is arranged in the up-down direction with respect to the upstream portion 10e1 and extends parallel to the upstream portion 10e1. The downstream portion 10e2 is connected to the outlet opening end 10c through the case-side reduced diameter flow path 10f. The curved portion 10e3 is a U-shaped portion that connects the upstream portion 10e1 and the downstream portion 10e2.

Such a flat flow path 10e is folded back such that the minor axis of the oval in the cross-sectional shape is along the up-down direction in both the upstream portion 10e1 and the downstream portion 10e2. For this reason, even if the flat flow path 10e is folded back, the height dimension of the central case 6b can be suppressed.

In the power conversion device 1 of the present embodiment as described above, the refrigerant X flowing through the supply refrigerant pipe 8 is discharged from the connection opening end 8d and flows from the inlet opening end 10b into the refrigerant flow path 10. Here, in the power conversion device 1 of the present embodiment, the supply refrigerant pipe 8 includes the refrigerant pipe-side reduced diameter flow path 8e in which flow path area decreases with increasing distance from the connection opening end 8d.

In the supply refrigerant pipe 8, as shown in FIG. 3, the refrigerant X flows from the small diameter flow path 8f toward the connection opening end 8d, so that, based on the flow direction of the refrigerant X, the flow path 8c expands at the refrigerant pipe-side reduced diameter flow path 8e. Therefore, when the refrigerant X flows from the small diameter flow path 8f of the supply refrigerant pipe 8 to the refrigerant pipe-side reduced diameter flow path 8e, the flow speed of the refrigerant X decreases and the pressure of the refrigerant X increases.

Since the refrigerant pipe-side reduced diameter flow path 8e continuously expands toward the connection opening end 8d, the inner wall surface of the refrigerant pipe-side reduced diameter flow path 8e is a tapered surface. Therefore, the flow of the refrigerant X can be prevented from being separated from the inner wall surface of the flow path 8c, and an increase in pressure loss can be suppressed.

Further, in the power conversion device 1 of the present embodiment, the main body case 6 includes, as a part of the refrigerant flow path 10, the case-side reduced diameter flow path 10d, which is reduced in diameter with increasing distance from the inlet opening end 10b. In the case-side reduced diameter flow path 10d, as shown in FIG. 3, the refrigerant X flows from the inlet opening end 10b toward the flat flow path 10e provided on the side opposite to the refrigerant pipe-side reduced diameter flow path 8e. Therefore, when the refrigerant X flows from the inlet opening end 10b into the case-side reduced diameter flow path 10d, the flow speed of the refrigerant X increases, and the pressure of the refrigerant X decreases to the same level as that in the small diameter flow path 8f of the supply refrigerant pipe 8.

Since the case-side reduced diameter flow path 10d is continuously reduced toward the flat flow path 10e, the inner wall surface of the case-side reduced diameter flow path 10d is a substantially tapered surface. Therefore, the flow of the refrigerant X can be prevented from being separated from the inner wall surface of the refrigerant flow path 10, and an increase in pressure loss can be suppressed.

When the small diameter flow path 8f of the supply refrigerant pipe 8 and the flat flow path 10e of the main body case 6, which have different shapes, are directly connected to each other, a stepped portion is formed at the boundary portion. For this reason, the flow of the refrigerant X collides with or is separated at the stepped portion, causing turbulence and an increase in pressure loss. In contrast, in the power conversion device 1 of the present embodiment, the refrigerant pipe-side reduced diameter flow path 8e and the case-side reduced diameter flow path 10d are provided, so that the flow of the refrigerant X can be prevented from being disturbed. Therefore, an increase in pressure loss can be suppressed.

The refrigerant X that has flowed into the refrigerant flow path 10 flows from the case-side reduced diameter flow path 10d into the flat flow path 10e. The refrigerant X that has flowed into the flat flow path 10e is guided by the flat flow path 10e and flows into the case-side reduced diameter flow path 10d connected to the outlet opening end 10c.

Thereafter, the refrigerant X is discharged from the outlet opening end 10c and flows from the connection opening end 9d into the discharge refrigerant pipe 9. The refrigerant X flows through the flat flow path 10e in this manner, so that the electronic components such as the intelligent power module 2, the capacitor 3, the reactor 4, and the DC-DC converter 5 are cooled.

Further, in the power conversion device 1 of the present embodiment, the main body case 6 includes, as a part of the refrigerant flow path 10, the case-side reduced diameter flow path 10f in which flow path area decreases with increasing distance from the outlet opening end 10c. In the case-side reduced diameter flow path 10f, as shown in FIG. 6, the refrigerant X flows from the flat flow path 10e toward the outlet opening end 10c, so that, based on the flow direction of the refrigerant X, the refrigerant flow path 10 expands at the case-side reduced diameter flow path 10f. Therefore, when the refrigerant X flows from the flat flow path 10e into the case-side reduced diameter flow path 10f, the flow speed of the refrigerant X decreases and the pressure of the refrigerant X increases.

Since the case-side reduced diameter flow path 10f continuously expands toward the outlet opening end 10c, the inner wall surface of the case-side reduced diameter flow path 10f is a substantially tapered surface. Therefore, the flow of the refrigerant X can be prevented from being separated from the inner wall surface of the refrigerant flow path 10, and an increase in pressure loss can be suppressed.

Further, in the power conversion device 1 of the present embodiment, the discharge refrigerant pipe 9 includes the refrigerant pipe-side reduced diameter flow path 9e that is reduced in diameter with increasing distance from the connection opening end 9d. In the refrigerant pipe-side reduced diameter flow path 9e, as shown in FIG. 6, the refrigerant X flows from the connection opening end 9d toward the small diameter flow path 9f provided on the side opposite to the refrigerant pipe-side reduced diameter flow path 9e. Therefore, when the refrigerant X flows from the connection opening end 9d into the refrigerant pipe-side reduced diameter flow path 9e, the flow speed of the refrigerant X increases, and the pressure of the refrigerant X decreases to the same level as that in the flat flow path 10e of the main body case 6.

Since the refrigerant pipe-side reduced diameter flow path 9e is continuously reduced toward the small diameter flow path 9f, the inner wall surface of the refrigerant pipe-side reduced diameter flow path 9e is a tapered surface. Therefore, the flow of the refrigerant X can be prevented from being separated from the inner wall surface of the flow path 9c, and an increase in pressure loss can be suppressed.

If the small diameter flow path 9f of the discharge refrigerant pipe 9 and the flat flow path 10e of the main body case 6, which have different shapes, are directly connected to each other, a stepped portion is formed at the boundary portion. For this reason, the flow of the refrigerant X collides with or is separated at the stepped portion, causing turbulence and an increase in pressure loss. In contrast, in the power conversion device 1 of the present embodiment, the refrigerant pipe-side reduced diameter flow path 9e and the case-side reduced diameter flow path 10f are provided, so that the flow of the refrigerant X can be prevented from being disturbed. Therefore, an increase in pressure loss can be suppressed.

The power conversion device 1 of the present embodiment as described above includes the electronic component that performs power conversion, such as the intelligent power module 2, the main body case 6, and the supply refrigerant pipe 8. The main body case 6 accommodates the intelligent power module 2 and the like. Further, the inlet opening end 10b of the refrigerant flow path 10 is provided in the main body case 6. The supply refrigerant pipe 8 has the flange 8b that is fixed to the outer wall surface of the main body case 6. Further, the supply refrigerant pipe 8 is connected to the inlet opening end 10b.

Further, in the power conversion device 1 of the present embodiment, the supply refrigerant pipe 8 has the connection opening end 8d that is directly connected to the inlet opening end 10b, the refrigerant pipe-side reduced diameter flow path 8e in which flow path area decreases with increasing distance from the connection opening end 8d, and the small diameter flow path 8f connected to the end portion of the refrigerant pipe-side reduced diameter flow path 8e on the side opposite to the connection opening end 8d.

Further, in the power conversion device 1 of the present embodiment, the main body case 6 has the case-side reduced diameter flow path 10d, which is a part of the refrigerant flow path 10, and the flat flow path 10e, which is a part of the refrigerant flow path 10. The case-side reduced diameter flow path 10d is a flow path in which flow path area decreases with increasing distance from the inlet opening end 10b. The flat flow path 10e is formed in a shape flatter than the small diameter flow path 8f and is connected to the end portion of the case-side reduced diameter flow path 10d on the side opposite to the inlet opening end 10b.

In the power conversion device 1 of the present embodiment as described above, the supply refrigerant pipe 8 has the flange 8b, and the flange 8b is fixed to the outer wall surface of the main body case 6. Therefore, the supply refrigerant pipe 8 and the main body case 6 can be connected to each other without inserting the supply refrigerant pipe 8 into the inlet opening end 10b of the main body case 6.

Therefore, there is no need to provide a portion where the end portion of the supply refrigerant pipe 8 is located inside the main body case 6, so that the main body case 6 can be made thinner. Further, the refrigerant flow path 10 has the flat flow path 10e formed in a shape flatter than the small diameter flow path 8f of the supply refrigerant pipe 8. Therefore, the main body case 6 in which the refrigerant flow path 10 is formed can be made thinner by an amount corresponding to the difference between the inner diameter dimension of the small diameter flow path 8f and the inner diameter dimension of the flat flow path 10e in a short direction of the flat flow path 10e, compared to a case where a flow path having the same shape as the small diameter flow path 8f is provided.

Further, in the power conversion device 1 of the present embodiment, the connection opening end 8d of the supply refrigerant pipe 8 and the inlet opening end 10b of the main body case 6 are connected to each other. Further, the supply refrigerant pipe 8 has the refrigerant pipe-side reduced diameter flow path 8e in which flow path area decreases with increasing distance from the connection opening end 8d, and the main body case 6 has the case-side reduced diameter flow path 10d in which flow path area decreases with increasing distance from the opening end. In the power conversion device 1 of the present embodiment as described above, compared to a case where the small diameter flow path 8f and the flat flow path 10e, which have different shapes, are directly connected to each other, the shape of the flow path can be changed gently, reducing pressure loss in the flow path.

Therefore, according to the power conversion device 1 of the present embodiment, it becomes possible to make the main body case 6 thinner while suppressing an increase in pressure loss, and to make the electronic device thinner while maintaining cooling efficiency. Further, the power conversion device 1 of the present embodiment as described above includes the electronic component such as the intelligent power module 2, the main body case 6, and the discharge refrigerant pipe 9. The main body case 6 accommodates the intelligent power module 2 and the like. Further, the outlet opening end 10c of the refrigerant flow path 10 is provided in the main body case 6. The discharge refrigerant pipe 9 has the flange 9b that is fixed to the outer wall surface of the main body case 6. Further, the discharge refrigerant pipe 9 is connected to the outlet opening end 10c.

Further, in the power conversion device 1 of the present embodiment, the discharge refrigerant pipe 9 has the connection opening end 9d that is directly connected to the outlet opening end 10c, the refrigerant pipe-side reduced diameter flow path 9e in which flow path area decreases with increasing distance from the connection opening end 9d, and the small diameter flow path 9f connected to the end portion of the refrigerant pipe-side reduced diameter flow path 9e on the side opposite to the connection opening end 9d.

Further, in the power conversion device 1 of the present embodiment, the main body case 6 has the case-side reduced diameter flow path 10d, which is a part of the refrigerant flow path 10, and the flat flow path 10e, which is a part of the refrigerant flow path 10. The case-side reduced diameter flow path 10d is a flow path in which flow path area decreases with increasing distance from the outlet opening end 10c. The flat flow path 10e is formed in a shape flatter than the small diameter flow path 9f and is connected to the end portion of the case-side reduced diameter flow path 10d on the side opposite to the outlet opening end 10c.

In the power conversion device 1 of the present embodiment as described above, the discharge refrigerant pipe 9 has the flange 9b, and the flange 9b is fixed to the outer wall surface of the main body case 6. Therefore, the discharge refrigerant pipe 9 and the main body case 6 can be connected to each other without inserting the discharge refrigerant pipe 9 into the outlet opening end 10c of the main body case 6. Therefore, there is no need to provide a portion where the end portion of the discharge refrigerant pipe 9 is located inside the main body case 6, so that the main body case 6 can be made thinner. Further, the refrigerant flow path 10 has the flat flow path 10e formed in a shape flatter than the small diameter flow path 9f of the discharge refrigerant pipe 9. Therefore, the main body case 6 in which the refrigerant flow path 10 is formed can be made thinner by an amount corresponding to the difference between the inner diameter dimension of the small diameter flow path 9f and the inner diameter dimension of the flat flow path 10e in the short direction of the flat flow path 10e, compared to a case where a flow path having the same shape as the small diameter flow path 9f is provided.

Further, in the power conversion device 1 of the present embodiment, the connection opening end 9d of the discharge refrigerant pipe 9 and the outlet opening end 10c of the main body case 6 are connected to each other. Further, the discharge refrigerant pipe 9 has the refrigerant pipe-side reduced diameter flow path 9e in which flow path area decreases with increasing distance from the connection opening end 9d, and the main body case 6 has the case-side reduced diameter flow path 10d in which flow path area decreases with increasing distance from the opening end. In the power conversion device 1 of the present embodiment as described above, compared to a case where the small diameter flow path 9f and the flat flow path 10e, which have different shapes, are directly connected to each other, the shape of the flow path can be changed gently, reducing pressure loss in the flow path.

Therefore, according to the power conversion device 1 of the present embodiment, it becomes possible to make the main body case 6 thinner while suppressing an increase in pressure loss, and to make the electronic device thinner while maintaining cooling efficiency.

Further, in the power conversion device 1 of the present embodiment, the flat flow path 10e is formed in a shape in which the height dimension in the up-down direction is smaller than the width dimension in the horizontal direction when viewed from a direction along the direction in which the refrigerant X flows. According to the power conversion device 1 of the present embodiment as described above, a reduction in thickness in the up-down direction can be realized and the power conversion device 1 can be made lower in height.

Further, in the power conversion device 1 of the present embodiment, the flat flow path 10e has the upstream portion 10e1, the downstream portion 10e2, and the curved portion 10e3. The upstream portion 10e1 is located on the upstream side in the flow direction of the refrigerant X and linearly extends in the horizontal direction. The downstream portion 10e2 is located on the downstream side in the flow direction of the refrigerant X. Further, the downstream portion 10e2 is arranged in the up-down direction with respect to the upstream portion 10e1 and extends parallel to the upstream portion 10e1. The curved portion 10e3 is formed in a U-shape that connects the upstream portion 10e1 and the downstream portion 10e2.

According to the power conversion device 1 of the present embodiment as described above, the flat flow path 10e can be formed in a folded manner. Therefore, the inlet opening end 10b and the outlet opening end 10c can be provided together on the same outer wall surface of the main body case 6. Therefore, the supply refrigerant pipe 8 and the discharge refrigerant pipe 9 can be arranged together.

Further, in the power conversion device 1 of the present embodiment, the flow path area of the flat flow path 10e is the same as the flow path area of the small diameter flow path 8f. Therefore, the flow rate in the supply refrigerant pipe 8 and the flow rate in the flat flow path 10e become the same, so that an increase in pressure loss can be suppressed.

Further, in the power conversion device 1 of the present embodiment, the flow path area of the flat flow path 10e is the same as the flow path area of the small diameter flow path 9f. Therefore, the flow rate in the discharge refrigerant pipe 9 and the flow rate in the flat flow path 10e become the same, so that an increase in pressure loss can be suppressed.

Further, in the power conversion device 1 of the present embodiment, the cross-sectional shape of the small diameter flow path 8f is a perfect circular shape, and the cross-sectional shape of the flat flow path 10e is an oval shape. According to the power conversion device 1 of the present embodiment as described above, the difference between the cross-sectional shape of the small diameter flow path 8f and the cross-sectional shape of the flat flow path 10e can be suppressed to be small, and changes in the inner wall surfaces of the flow path 8c and the refrigerant flow path 10 can be reduced. Therefore, according to the power conversion device 1 of the present embodiment, it is possible to further suppress an increase in pressure loss.

Further, in the power conversion device 1 of the present embodiment, the cross-sectional shape of the small diameter flow path 9f is a perfect circular shape, and the cross-sectional shape of the flat flow path 10e is an oval shape. According to the power conversion device 1 of the present embodiment as described above, the difference between the cross-sectional shape of the small diameter flow path 9f and the cross-sectional shape of the flat flow path 10e can be suppressed to be small, and changes in the inner wall surfaces of the flow path 9c and the refrigerant flow path 10 can be reduced. Therefore, according to the power conversion device 1 of the present embodiment, it is possible to further suppress an increase in pressure loss.

Further, in the power conversion device 1 of the present embodiment, the connection opening end 8d and the inlet opening end 10b are formed in the same shape. Therefore, it is possible to suppress the occurrence of a step at the boundary portion between the connection opening end 8d and the inlet opening end 10b. Therefore, according to the power conversion device 1 of the present embodiment, it is possible to further suppress an increase in pressure loss.

Further, in the power conversion device 1 of the present embodiment, the connection opening end 9d and the outlet opening end 10c are formed in the same shape. Therefore, it is possible to suppress the occurrence of a step at the boundary portion between the connection opening end 9d and the outlet opening end 10c. Therefore, according to the power conversion device 1 of the present embodiment, it is possible to further suppress an increase in pressure loss.

Second Embodiment

Subsequently, a second embodiment of the present invention will be described with reference to FIG. 9. In the description of the present embodiment, the description of the same parts as in the first embodiment will be omitted or simplified.

Figure 9:
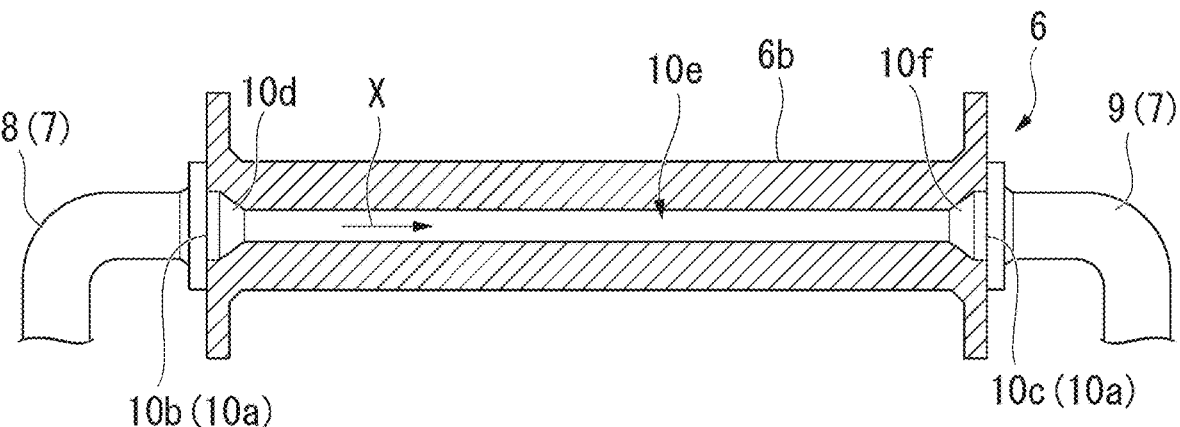
FIG. 9 is a schematic sectional view including a central case included in a power conversion device according to a second embodiment of the present invention.

FIG. 9 is a schematic sectional view including the central case 6b included in a power conversion device of the present embodiment. As shown in this drawing, in the power conversion device of the present embodiment, the inlet opening end 10b and the outlet opening end 10c of the refrigerant flow path 10 are provided on the outer wall surfaces that are located on the opposite sides of the central case 6b. That is, the inlet opening end 10b is provided on one outer wall surface of the central case 6b, and the outlet opening end 10c is provided on the outer wall surface located on the side opposite to the outer wall surface on which the inlet opening end 10b is provided.

Further, in the power conversion device of the present embodiment, the flat flow path 10e is provided to linearly extend so as to connect the inlet opening end 10b and the outlet opening end 10c, without being folded back.

Also in the power conversion device of the present embodiment as described above, as with the power conversion device of the first embodiment, the supply refrigerant pipe 8 has the flange 8b, and the flange 8b is fixed to the outer wall surface of the main body case 6. Therefore, the supply refrigerant pipe 8 and the main body case 6 can be connected to each other without inserting the supply refrigerant pipe 8 into the inlet opening end 10b of the main body case 6. Therefore, there is no need to provide a portion where the end portion of the supply refrigerant pipe 8 is located inside the main body case 6, so that the main body case 6 can be made thinner. Further, the refrigerant flow path 10 has the flat flow path 10e formed in a shape flatter than the small diameter flow path 8f of the supply refrigerant pipe 8. Therefore, the main body case 6 in which the refrigerant flow path 10 is formed can be made thinner by an amount corresponding to the difference between the inner diameter dimension of the small diameter flow path 8f and the inner diameter dimension of the flat flow path 10e in a short direction of the flat flow path 10e, compared to a case where a flow path having the same shape as the small diameter flow path 8f is provided.

Further, also in the power conversion device of the present embodiment, the connection opening end 8d of the supply refrigerant pipe 8 and the inlet opening end 10b of the main body case 6 are connected to each other. Further, the supply refrigerant pipe 8 has the refrigerant pipe-side reduced diameter flow path 8e in which flow path area decreases with increasing distance from the connection opening end 8d, and the main body case 6 has the case-side reduced diameter flow path 10d in which flow path area decreases with increasing distance from the opening end. Also, in the power conversion device of the present embodiment as described above, compared to a case where the small diameter flow path 8f and the flat flow path 10e, which have different shapes, are directly connected to each other, the shape of the flow path can be changed gently, so that pressure loss in the flow path can be reduced.

Further, in the power conversion device of the present embodiment, the discharge refrigerant pipe 9 has the flange 9b, and the flange 9b is fixed to the outer wall surface of the main body case 6. Therefore, the discharge refrigerant pipe 9 and the main body case 6 can be connected to each other without inserting the discharge refrigerant pipe 9 into the outlet opening end 10c of the main body case 6. Therefore, there is no need to provide a portion where the end portion of the discharge refrigerant pipe 9 is located inside the main body case 6, so that the main body case 6 can be made thinner. Further, the refrigerant flow path 10 has the flat flow path 10e formed in a shape flatter than the small diameter flow path 9f of the discharge refrigerant pipe 9. Therefore, the main body case 6 in which the refrigerant flow path 10 is formed can be made thinner by an amount corresponding to the difference between the inner diameter dimension of the small diameter flow path 9f and the inner diameter dimension of the flat flow path 10e in the short direction of the flat flow path 10e, compared to a case where a flow path having the same shape as the small diameter flow path 9f is provided.

Further, also in the power conversion device of the present embodiment, the connection opening end 9d of the discharge refrigerant pipe 9 and the outlet opening end 10c of the main body case 6 are connected to each other. Further, the discharge refrigerant pipe 9 has the refrigerant pipe-side reduced diameter flow path 9e in which flow path area decreases with increasing distance from the connection opening end 9d, and the main body case 6 has the case-side reduced diameter flow path 10d in which flow path area decreases with increasing distance from the opening end. Also, in the power conversion device of the present embodiment as described above, compared to a case where the small diameter flow path 9f and the flat flow path 10e, which have different shapes, are directly connected to each other, the shape of the flow path can be changed gently, so that pressure loss in the flow path can be reduced.

Therefore, according to the power conversion device of the present embodiment, it becomes possible to make the main body case 6 thinner while suppressing an increase in pressure loss, and to make the electronic device thinner while maintaining cooling efficiency.

Although the preferred embodiments of the present invention have been described above with reference to the accompanying drawings, it goes without saying that the present invention is not limited to the above embodiments. The various shapes, combinations, and the like of each of the constituent members shown in the above-described embodiment are merely examples and can be variously changed based on design requirements and the like without departing from the gist of the present invention.

Figure 10:
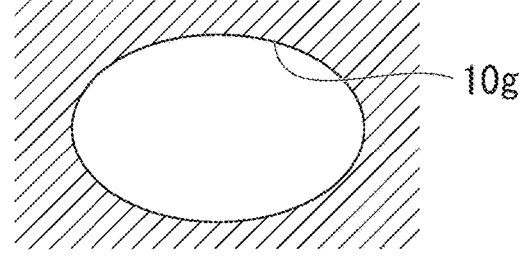
FIG. 10 is a diagram showing a modification example of the cross-sectional shape of a flat flow path.
Figure 11:
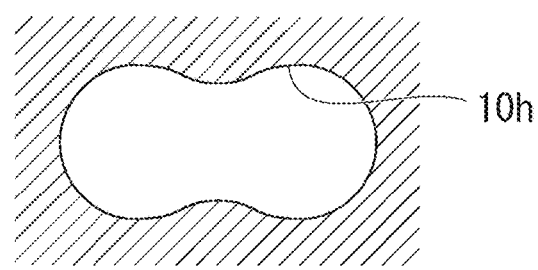
FIG. 11 is a diagram showing a modification example of the cross-sectional shape of the flat flow path.

For example, in the embodiments described above, the configuration including the flat flow path 10e having an oval cross-sectional shape has been described. However, the present invention is not limited thereto. For example, as shown in FIG. 10, instead of the flat flow path 10e, it is also possible to adopt a configuration including a flat flow path 10g having an elliptical cross-sectional shape. Further, as shown in FIG. 11, instead of the flat flow path 10e, it is also possible to adopt a configuration including a flat flow path 10h narrowed at the center in the width direction.

Further, in the embodiments described above, the example in which the electronic device of the present invention is applied to a power conversion device has been described. However, the present invention is not limited thereto. The present invention can be applied to an electronic device including an electronic component, a main body case which accommodates the electronic component and in which an opening end of a refrigerant flow path is provided, and a refrigerant pipe that is connected to an opening end of the main body case.

The embodiments described above can also be described as, for example, the following additional remarks.

(Additional Remark 1)

An electronic device including:

an electronic component;

a main body case which accommodates the electronic component and in which an opening end of a refrigerant flow path is provided; and a refrigerant pipe that has a flange which is fixed to an outer wall surface of the main body case, and that is connected to the opening end, in which the refrigerant pipe has a connection opening end that is directly connected to the opening end, a refrigerant pipe-side reduced diameter flow path in which flow path area decreases with increasing distance from the connection opening end, and a small diameter flow path connected to an end portion of the refrigerant pipe-side reduced diameter flow path on a side opposite to the connection opening end, and the main body case has, as parts of the refrigerant flow path, a case-side reduced diameter flow path in which flow path area decreases with increasing distance from the opening end, and a flat flow path formed in a shape flatter than the small diameter flow path and connected to an end portion of the case-side reduced diameter flow path on a side opposite to the opening end.

(Additional Remark 2)

In the electronic device described in Additional remark 1, the flat flow path is formed in a shape in which a height dimension in an up-down direction is smaller than a width dimension in a horizontal direction when viewed from a direction along a direction in which a refrigerant flows.

(Additional Remark 3)

In the electronic device described in Additional remark 2, the flat flow path has an upstream portion that is located on an upstream side in a flow direction of the refrigerant and linearly extends in the horizontal direction, a downstream portion that is located on a downstream side in the flow direction of the refrigerant, is arranged in the up-down direction with respect to the upstream portion, and extends parallel to the upstream portion, and a U-shaped curved portion that connects the upstream portion and the downstream portion.

(Additional Remark 4)

In the electronic device described in any one of Additional remarks 1 to 3, a flow path area of the flat flow path is the same as a flow path area of the small diameter flow path.

(Additional Remark 5)

In the electronic device described in any one of Additional remarks 1 to 4, a cross-sectional shape of the small diameter flow path is a perfect circular shape, and a cross-sectional shape of the flat flow path is an oval shape.

(Additional Remark 6)

In the electronic device described in any one of Additional remarks 1 to 5, the connection opening end and the opening end are formed in the same shape.

(Additional Remark 7)

A power conversion device including:

the electronic component that performs power conversion; and the electronic device according to any one of Additional remarks 1 to 6.

While preferred embodiments of the invention have been described and illustrated above, it should be understood that these are exemplary examples of the invention and are not to be considered as limiting. Additions, omissions, substitutions, and other modifications can be made without departing from the scope of the invention. Accordingly, the invention is not to be considered as being limited by the foregoing description and is only limited by the scope of the appended claims.

EXPLANATION OF REFERENCES

1: power conversion device

2: intelligent power module (electronic component)

3: capacitor (electronic component)
4: reactor (electronic component)
5: DC-DC converter (electronic component)
6: main body case
7: refrigerant pipe
8: supply refrigerant pipe
8*a*: pipe main body part
8*b*: flange
8*b*1: contact surface
8*b*2: groove portion
8*b*3: screw hole
8*c*: flow path
8*d*: connection opening end
8*e*: refrigerant pipe-side reduced diameter flow path
8*f*: small diameter flow path
9: discharge refrigerant pipe
9*a*: pipe main body part
9*b*: flange
9*b*1: contact surface
9*b*2: groove portion
9*b*3: screw hole
9*c*: flow path
9*d*: connection opening end
9*e*: refrigerant pipe-side reduced diameter flow path
9*f*: small diameter flow path
10: refrigerant flow path
10*a*: opening end
10*b*: inlet opening end
10*c*: outlet opening end
10*d*: case-side reduced diameter flow path
10*e*: flat flow path
10*e*1: upstream portion
10*e*2: downstream portion
10*e*3: curved portion
10*f*: case-side reduced diameter flow path
10*g*: flat flow path
10*h*: flat flow path
11: seal ring
X: refrigerant

What is claimed is:

1. An electronic device comprising:
an electronic component;
a main body case which accommodates the electronic component and in which an opening end of a refrigerant flow path is provided; and
a refrigerant pipe that has a flange which is fixed to an outer wall surface of the main body case, and that is connected to the opening end,
wherein the refrigerant pipe has
a connection opening end that is directly connected to the opening end,
a refrigerant pipe-side reduced diameter flow path in which flow path area decreases with increasing distance from the connection opening end, the refrigerant pipe-side reduced diameter flow path being connected to the connection opening end, and
a small diameter flow path connected to an end portion of the refrigerant pipe-side reduced diameter flow path on a side opposite to the connection opening end, and
the main body case has, as parts of the refrigerant flow path,
a case-side reduced diameter flow path in which flow path area decreases with increasing distance from the connection opening end, the case-side reduced diameter flow path being connected to the connection opening end,
a flat flow path formed in a shape flatter than the small diameter flow path and connected to an end portion of the case-side reduced diameter flow path on a side opposite to the opening end, and
an inner wall surface of the refrigerant pipe-side reduced diameter flow path and an inner wall surface of the case-side reduced diameter flow path are tapered surfaces.

2. The electronic device according to claim 1, wherein the flat flow path is formed in a shape in which a height dimension in an up-down direction is smaller than a width dimension in a horizontal direction when viewed from a direction along a direction in which a refrigerant flows.

3. The electronic device according to claim 2, wherein the flat flow path has
an upstream portion that is located on an upstream side in a flow direction of the refrigerant and linearly extends in the horizontal direction,
a downstream portion that is located on a downstream side in the flow direction of the refrigerant, is arranged in the up-down direction with respect to the upstream portion, and extends parallel to the upstream portion, and
a curved portion that is a U-shaped portion and connects the upstream portion and the downstream portion.

4. The electronic device according to claim 1, wherein a flow path area of the flat flow path is the same as a flow path area of the small diameter flow path.

5. The electronic device according to claim 1, wherein a cross-sectional shape of the small diameter flow path is a perfect circular shape, and a cross-sectional shape of the flat flow path is an oval shape.

6. The electronic device according to claim 1, wherein the connection opening end and the opening end are formed in the same shape.

7. A power conversion device comprising:
the electronic component that performs power conversion; and
the electronic device according to claim 1.

\* \* \* \* \*